(12) United States Patent
Darmawaskita et al.

(10) Patent No.: US 6,515,464 B1
(45) Date of Patent: Feb. 4, 2003

(54) INPUT VOLTAGE OFFSET CALIBRATION OF AN ANALOG DEVICE USING A MICROCONTROLLER

(75) Inventors: Hartono Darmawaskita, Chandler, AZ (US); Layton Eagar, Mesa, AZ (US); Miguel Moreno, Gilbert, AZ (US)

(73) Assignee: Microchip Technology Incorporated, Chandler, AZ (US)

(*) Notice: Subject to any disclaimer, the term of this patent is extended or adjusted under 35 U.S.C. 154(b) by 88 days.

(21) Appl. No.: 09/675,356

(22) Filed: Sep. 29, 2000

(51) Int. Cl.$^7$ ............................................. G01R 19/00
(52) U.S. Cl. ...................... 324/76.11; 324/601; 324/606
(58) Field of Search .................... 324/601, 602–611, 324/76.11, 672, 130

(56) References Cited

U.S. PATENT DOCUMENTS

| | | | | |
|---|---|---|---|---|
| 4,939,520 A | * | 7/1990 | Biglow | 341/128 |
| 5,287,063 A | * | 2/1994 | Izawa | 324/761 |
| 5,596,322 A | * | 1/1997 | Marsh et al. | 341/118 |
| 5,642,057 A | * | 6/1997 | Oke et al. | 324/763 |
| 6,184,659 B1 | * | 2/2001 | Darmawaskita | 320/137 |
| 6,341,135 B1 | * | 1/2002 | Fawal et al. | 324/130 |

* cited by examiner

Primary Examiner—Michael Sherry
Assistant Examiner—Tung X. Nguyen
(74) Attorney, Agent, or Firm—Baker Botts L.L.P.

(57) ABSTRACT

Input offset voltage calibration of an analog device, or plurality of analog devices, is controlled by a microcontroller. The microcontroller and analog device(s) are fabricated on an integrated circuit die or in a multi-chip package. The microcontroller applies a digital word to an input offset voltage compensation circuit of the analog device for generating input offset voltage compensation. The analog device is switched to a calibrate mode and a voltage comparator compares the output of the analog input device and a voltage reference. When the output of the analog input device is equal to or greater than the voltage reference, the comparator output signals the microcontroller by changing its output logic level. The input offset voltage compensation circuit of the analog input device has a storage register or memory that retains the digital word which compensates for the input offset voltage.

27 Claims, 3 Drawing Sheets

INPUT VOLTAGE OFFSET CALIBRATION OF AN ANALOG DEVICE USING A MICROCONTROLLER

BACKGROUND OF THE INVENTION

The invention relates to integrated circuit microcontrollers having analog input devices and, more particularly, to input voltage offset calibration of these analog input devices.

DESCRIPTION OF THE RELATED TECHNOLOGY

Integrated circuits are becoming far more sophisticated while continuing to drop in price. Combinations of both analog and digital functions fabricated on an integrated circuit die, or packaged in a multi-chip package (MCP), are becoming more prevalent and are further increasing the usefulness and reducing the cost of consumer and industrial products. The combination of a microcontroller, and analog and digital circuit functions on an integrated circuit die or in an MCP has also expanded the useful range of applications. Consumer and commercial products, such as, for example, but not limited to, appliances, telecommunications devices, automobiles, security systems, full-house instant hot water heaters, thermostats and the like, are being controlled by integrated circuit microcontrollers. Analog inputs for receiving sensor information and analog outputs for controlling functions are necessary for the application of these microcontrollers. Heretofore separate and discrete analog-to-digital and digital-to-analog interfaces were used to connect the digital microcontroller to the outside analog world.

Analog input devices such as an analog-to-digital converter (ADC) in conjunction with a separate operational amplifier (op-amp) were used to convert a time-varying analog signal into digital representations thereof for application to digital inputs and use thereof by the microcontroller. Voltage and current levels were also detected by discrete integrated circuit voltage comparators that changed a digital output state when a certain analog value was present on the input of the comparator.

The op-amp (and comparator) is generally a differential input (inverting and noninverting inputs) analog device, and the circuit of the op-amp has inherent direct current (DC) input offset voltage that causes the output of the op-amp to be nonzero with a zero input voltage between the differential inputs. Many applications require an op-amp with a very small input offset voltage. To achieve small input offset voltage, normally a calibration step in the production of the op-amp is required. The calibration is typically performed at one operating point (e.g., temperature, common mode voltage, etc.) such that changes in operating environment are not compensated for. This calibration step takes time during manufacturing/testing and is therefore generally expensive to perform. Calibration of the op-amp at the time of manufacture brings the op-amp within the desired specifications, but cannot compensate for parameter changes affecting the op-amp calibration during operation, such as variations in voltage, temperature, etc.

Heretofore, eliminating or minimizing input offset voltage drift during operation of the op-amp was generally performed with a chopper-stabilized amplifier. The chopper-stabilized amplifier continuously sampled the op-amp's input offset voltage, and subtracted this sampled input offset voltage from the desired signal voltage at the input of the op-amp. During the sampling period, the op-amp was not available for receiving the desired signal voltage. Thus, the effect of sampling in a chopper-stabilized amplifier is to limit the signal bandwidth of the op-amp. Chopper-stabilized amplifiers generally have a very low bandwidth because signal frequencies must be limited to less than half of the sampling frequency, otherwise aliasing errors will occur. Another drawback to the chopper-stabilized amplifier is that the continuous sampling causes the op-amp to be noisier than a non-chopper-stabilized amplifier.

The chopper-stabilized amplifier and other ways of calibrating the op-amp for minimum input offset voltage during operation in an application, generally, require external components such as switches, digital-to-analog converters, capacitors, etc. This requires additional components and printed circuit board space, along with increased assembly and testing time that is more expensive, and, generally, produces a less reliable product.

Technology has now advance to the point where analog input devices can be fabricated on the same integrated circuit die on which the digital microcontroller and its support logic and memories are also fabricated. This creates an additional problem in that the equipment used to test the digital microcontroller functions are not capable of performing on-line calibration of analog functions efficiently.

What is needed is a microcontroller based integrated circuit having both analog and digital functions, where the analog functions may be easily calibrated during initial manufacturing/testing and, additionally, may be calibrated in a system application so as to remain in or meet the desired specifications and operating parameters over all operating temperature, voltage, current, speed, power, pressure, humidity, etc., that may be encountered during normal operation, and that can be mass-produced to reduce overall product costs.

SUMMARY OF THE INVENTION

The invention overcomes the above-identified problems as well as other shortcomings and deficiencies of existing technologies by providing in a single integrated circuit package a system, method and apparatus for minimizing input offset voltage of an analog input device over all operating parameters. The system, method and apparatus of the present invention, may also be utilized to minimize the input offset voltage of a plurality of analog input devices on an integrated circuit die or in an MCP. A calibration circuit, used for minimizing the input offset voltage, and analog input device(s) may be fabricated in combination with a microcontroller system on an integrated circuit die or in an MCP. The calibration circuit of the present invention may quickly and easily compensate for input offset voltage of the analog input device. This compensation may be performed during initial manufacturing/testing and, in addition, may be performed at various times during the operation of the analog input device so as to more effectively maintain desired parameters and specifications over all of the operating conditions of temperature, voltage, current, speed, power, pressure, humidity, etc.

In an embodiment of the input voltage offset calibration circuit of the present invention, the analog input device has input offset voltage compensation or a trimming circuit that counteracts or compensates for the device input offset voltage by applying, for example, but not limited to, an opposite polarity voltage between the differential inputs of the analog input device so as to minimize the resulting voltage error at the output of the analog device. Switching of resistances, current sources and/or voltage sources in the differential input circuit of the analog input device may be used to compensate for the input offset voltage error. Other ways of compensating for the input offset voltage error now known or used in the future may be utilized in the present invention so long as they can be controlled by applying a digital value thereto.

A microcontroller applies a digital word to the input offset voltage compensation circuit when determining a digital value representative of the required input offset voltage compensation. A linear search or binary search of various digital values of the digital word may be used by the microcontroller calibration software program (firmware). During input offset voltage calibration, the inverting and non-inverting inputs and output of the analog input device are connected to feedback gain determining resistors, a reference voltage and a voltage comparator.

The voltage comparator compares the output of the analog input device and a voltage reference. When the output of the analog input device is equal to or greater than the voltage reference, the comparator output switches from a first logic level to a second logic level. The output of the comparator is connected to the microcontroller and signals the microcontroller by, for example, but not limited to, either an interrupt request input or by changing its output logic level as a status bit sampled by the microcontroller. The input offset voltage compensation circuit of the analog input device may have a storage register or memory that retains the digital value required for compensating the input offset voltage.

The voltage reference may be programmable for selecting a desired voltage value to be applied to the analog input device and comparator inputs during the calibration cycle. This feature of the invention allows the ability to vary the voltage reference so as to facilitate calibration at the common mode voltage which is very close to that of the application of use. The appropriate voltage reference value may be written to a control register associated with the voltage reference circuit before initiating the auto calibration of the analog input device. Different voltage reference values may be used for different analog input devices during input offset voltage compensation calibration thereof.

In another embodiment of the invention, a plurality of analog input devices may have their input offset voltages compensated for by multiplexing the comparator input between each of the plurality of analog input devices during calibration thereof The analog input devices have a common bus interface to the microcontroller. Thereby circuits and die area are reduced, saving costs and improving reliability.

When the input offset voltage calibration firmware in the microcontroller determines that the op-amp needs to be calibrated (to zero the input offset voltage), a calibration enable bit of a register in the microcontroller may be set by the firmware. Once this bit is set, the calibration function takes control of the op-amp operation, and a changing digital calibration word is applied to the op-amp while the microcontroller, in conjunction with the comparator, searches for the proper calibration value of the digital calibration word that will minimize the input offset voltage of the op-amp. Once this calibration operation has successfully completed, the op-amp will operate with minimum input offset voltage. The calibration enable bit is reset to indicate completion of the calibration process for that op-amp. Each analog input device (op-amp, comparator, multiplier, logarithmic amplifier, etc.) may have a unique calibration enable bit in the microcontroller register. Once the calibration enable bit is reset, that op-amp is now available to operate continuously, not being uninterrupted in time (not chopped), at full bandwidth.

A feature of the invention is calibration of input offset voltage for an analog input device, using a microcontroller, at any time during operation of the device.

Another feature is calibration of input offset voltages for a plurality of analog input devices using a microcontroller.

An advantage of the present invention is not having to calibrate an analog input device during manufacturing/testing of the device.

Another advantage is being able to dynamically calibrate the analog input device on demand and during operation thereof over all operating conditions.

Still another advantage is using only one calibration circuit to calibrate a plurality of analog input devices on an integrated circuit die or in an MCP.

Another advantage is using the same auto-calibration circuit for calibrating both op-amp and comparator analog input devices.

Other and further features and advantages will be apparent from the following description of presently preferred embodiments of the invention, given for the purpose of disclosure and taken in conjunction with the accompanying drawings.

DETAILED DESCRIPTION OF THE PREFERRED EMBODIMENTS

Figure 1:
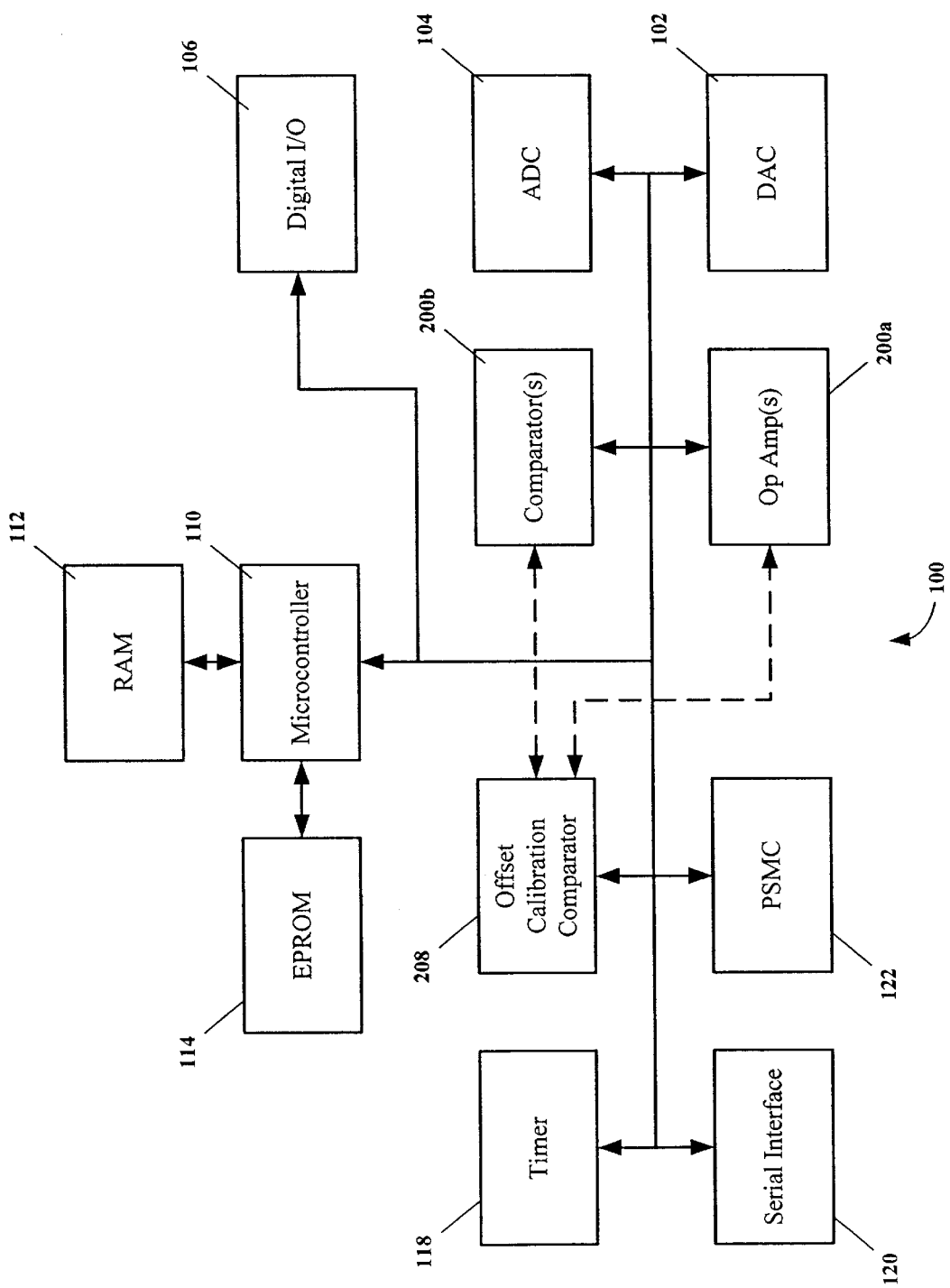
FIG. 1 is a schematic block diagram of a microcontroller system having integral analog and digital devices and input-output functions in a single integrated circuit.

The invention is a microprocessor in combination with at least one analog input device in which an input offset voltage of the analog input device is minimized during a calibration cycle controlled by the microcontroller. The invention may be used to maintain close tolerance specifications of the analog input device over a wide range of operating conditions. The microcontroller system and the at least one analog input device, having input offset voltage calibration functionality, are fabricated on an integrated circuit die or in an MCP. The microcontroller controlled calibration function may also be used for a plurality of analog input devices fabricated on an integrated circuit die or in an MCP.

Referring now to the drawings, the details of preferred embodiments of the invention are schematically illustrated. Like elements in the drawings will be represented by like numbers, and similar elements will be represented by like numbers with a different lower case letter suffix.

Referring to FIG. 1, a schematic block diagram of a microcontroller system having integral analog and digital devices and input-output functions in a single integrated circuit is illustrated. The integrated circuit microcontroller system having integral analog and digital devices is generally represented by the numeral 100 and comprises a digital-to-analog converter (DAC) 102, an analog-to-digital converter (ADC) 104, digital input-output (I/O) 106, a comparator(s) 200*b*, a microcontroller 110, random access memory (RAM) 112, electrically programmable read-only memory (EPROM) 114, a timer 118, a serial interface 120, a programmable switching mode controller (PSMC) 122 and a programmable operational amplifier(s) (op-amp) 200a. FIG. 1 is a schematic block diagram that is illustrative of a typical microcontroller system on an integrated circuit die or in an integrated circuit package having at least one integrated circuit die (MCP). It is contemplated and within the scope of the present invention that the microcontroller system 100 may have more or fewer functions than what is illustrated in FIG. 1.

The microcontroller system 100 may be fabricated on one or more integrated circuit dice and enclosed in an integrated circuit package. The integrated circuit package may be, for example, but not limited to, plastic dual in-line package (PDIP), small outline (SO), shrink small outline package (SSOP), thin shrink small outline package (TSSOP), windowed ceramic dual in-line package (CERDIP), leadless chip carrier (LCC), plastic leaded chip carrier (PLCC), plastic quad flatpack package (PQFP), thin quad flatpack package (TQFP), pin grid array (PGA), ball grid array (BGA), TO-220, TO-247 and TO-263.

Figure 2:
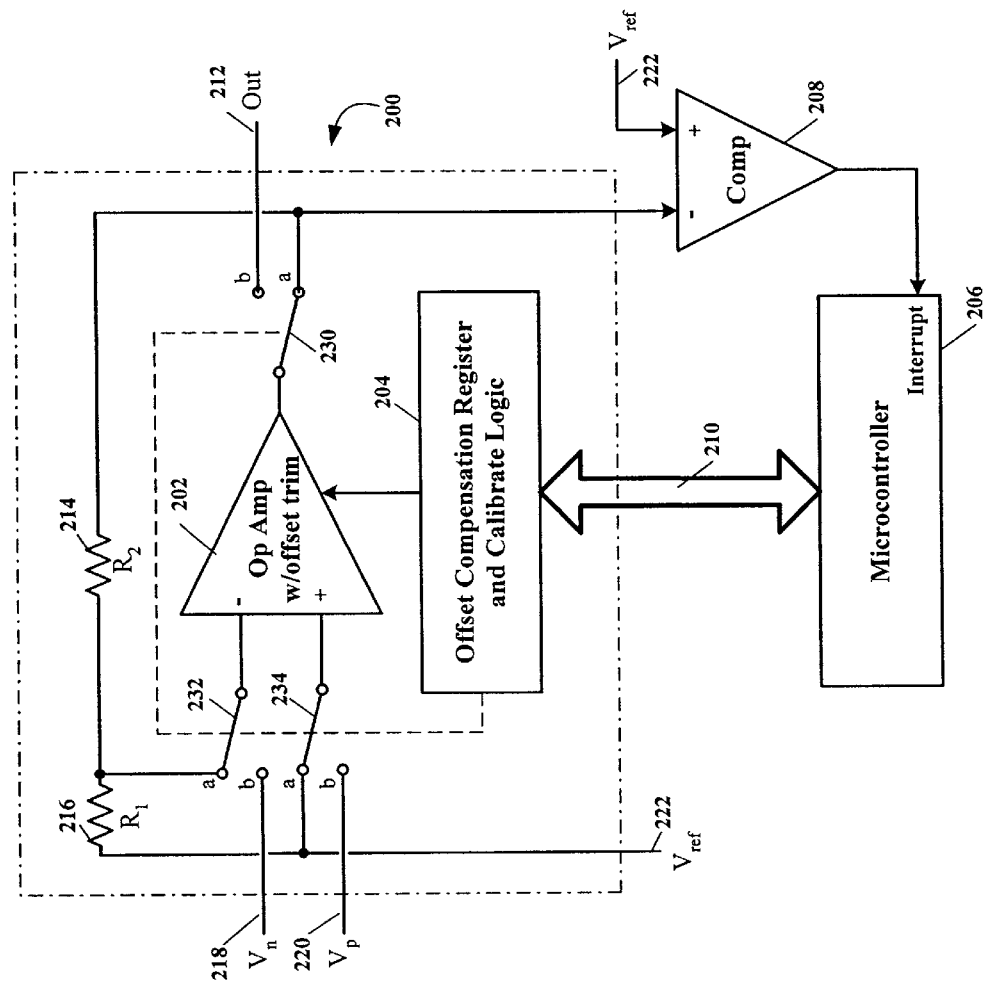
FIG. 2 is a schematic block diagram of a microprocessor and analog input device adapted for minimizing input offset voltage of the analog input device during a calibration cycle, according to the present invention.

Referring now to FIG. 2, a schematic block diagram of a system comprising a microprocessor and analog input device adapted for minimizing input offset voltage of the analog input device during a calibration cycle is illustrated. An analog input device adapted for input offset voltage compensation is generally indicated by the numeral 200 and comprises an op-amp 202 having an offset trim circuit (not illustrated), switches 230, 232 and 234, gain-control feedback resistors 214 and 216, and offset compensation register and calibrate logic 204. A comparator 208 and the microcontroller 206 are connected to the analog input device adapted for input offset voltage compensation 200. The op-amp 202 has a noninverting input (+) and an inverting input (−), which are configured as differential inputs, and an output connected to switch 230. The switch 230 connects the output of the op-amp 202 to either the comparator 208 or to an output node 212. A data and control bus 210 connects the microprocessor 210 to the offset compensation register and calibrate logic 204.

During calibration for minimizing the input voltage offset of the op-amp 202, switches 230, 232 and 234 are in position "a" (normal operation is position "b"). The inputs of the op-amp 202 are thereby connected to a reference voltage 222, and a gain-control resistor feedback network, comprising resistors 214 and 216, are connected to the op-amp 202 so as to establish a high-gain circuit for determining subsequent calibration input voltage offset compensation. When the switches 230, 232 and 234 are in position "a" (calibrate), they effectively establish a high gain differential input amplifier circuit (op-amp 202) having both inputs connected to a voltage reference, Vref, at node 222. Vref defines the input common mode voltage that the op-amp 202 will be calibrated at. The output of the op-amp 202 is connected to the negative input of the comparator 208 through switch 230. The voltage reference, Vref, is also connected to the positive input of the comparator 208 so as to maintain a common reference.

The offset trim circuit of the op-amp 202 compensates for input offset voltage that would drive the output of the op-amp 202 to an undesired value when the inputs of the op-amp 202 are at substantially the same voltage potential. The offset compensation register and calibrate logic 204 is activated by command and control signals, on the data and control bus 210, from the microcontroller 206. The offset compensation register and calibrate logic 204 controls the switches 230, 232 and 234 so that they are in position "a" during a calibrate cycle and in position "b" during normal operation.

The microcontroller 206 sends digital words over the bus 210 to the offset compensation register and calibrate logic 204 when determining a digital value representative of the required input offset voltage compensation. Linear search, binary search and the like may be used to generate the digital values applied to the offset compensation register and calibrate logic 204. The comparator 208 monitors the output of the op-amp 202, and when the op-amp 202 output is substantially equal to the voltage reference, Vref, the output of the comparator 208 changes logic levels and thereby signals the microcontroller 206. The comparator 208 may signal the microcontroller 206 through an interrupt or the microcontroller 206 may monitor a change in a status bit of a digital input (not illustrated) representative of the logic state of the comparator 208 output. The signal from the comparator 208 indicates that the input offset voltage of the op-amp 202 has been compensated to a desired value, and the analog device 200 may now be put back into operation by changing the switches 230, 232 and 234 back to position "b." The digital value that minimizes the input offset voltage of the op-amp 202, as described hereinabove, is stored in the offset compensation register and calibrate logic 204.

The output voltage (as referenced to ground) of the op-amp 202 may be given by formula (1) below:

$$Vout \approx Vref \pm Vos(1+R2/R1) \tag{1}$$

Where:

Vout=op-amp (amplifier) output voltage

Vref=reference input voltage

Vos=op-amp (amplifier) offset

R1, R2=resistors used to set feedback gain of op-amp when compensating for offset as shown by formula (1) above.

The output voltage of op-amp 202 is mainly determined by the ratio of R2 and R1 and the magnitude of the offset voltage of op-amp 202. The output of the op-amp 202 drives the inverting input, and Vref drives the noninverting input of the comparator 208. At the start of calibration, the output of the op-amp 202 will cause the output of the comparator 208 to a logic level state depending upon the magnitude and polarity of the op-amp 202 input offset voltage. The output (as referenced to ground) of the comparator 208 may be given by formula (2) below:

$$Vocmp \approx (Vout-Vref \pm Voscmp)*Aolcmp+Vcmo \tag{2}$$

Where:

Vocmp=comparator output voltage

Vout=op-amp output voltage

Vref=reference input voltage

Voscmp=comparator offset

Aolcmp=comparator open loop gain

Vcmo=comparator common mode output voltage

The op-amp 202 offset voltage is amplified using the resistor network R1, R2 around the op-amp 202 so as to reduce errors that may be introduced by the comparator 208 offset and its finite open-loop gain. For example, given the following parameters:

Vocmp=3.5 volts (output voltage to drive digital cells to a correct state)

Vref=2.5 volts
Voscmp=1 mv
Aolcmp=80 dB
Vcmo=2.5 volts

Using formula (1), Vout is determined to be 1.1 mv. This is the minimum output voltage required to drive the comparator 204 output to a magnitude sufficient to drive digital cells to the correct state. For a resistive gain of (1+R2/R1)=50, the minimum residual op-amp 202 offset error due to the comparator errors is determined to be 22 microvolts.

The calibration trim step size is preferably larger than the error calculated from formula (2), due to comparator 208 errors. The aforementioned calibration process may be periodically repeated when an operating parameter(s) may have changed. The input offset error is thereby substantially compensated for under all operating conditions. This also allows the analog input device to maintain close tolerance to desired specifications for more critical or demanding applications.

Figure 3:
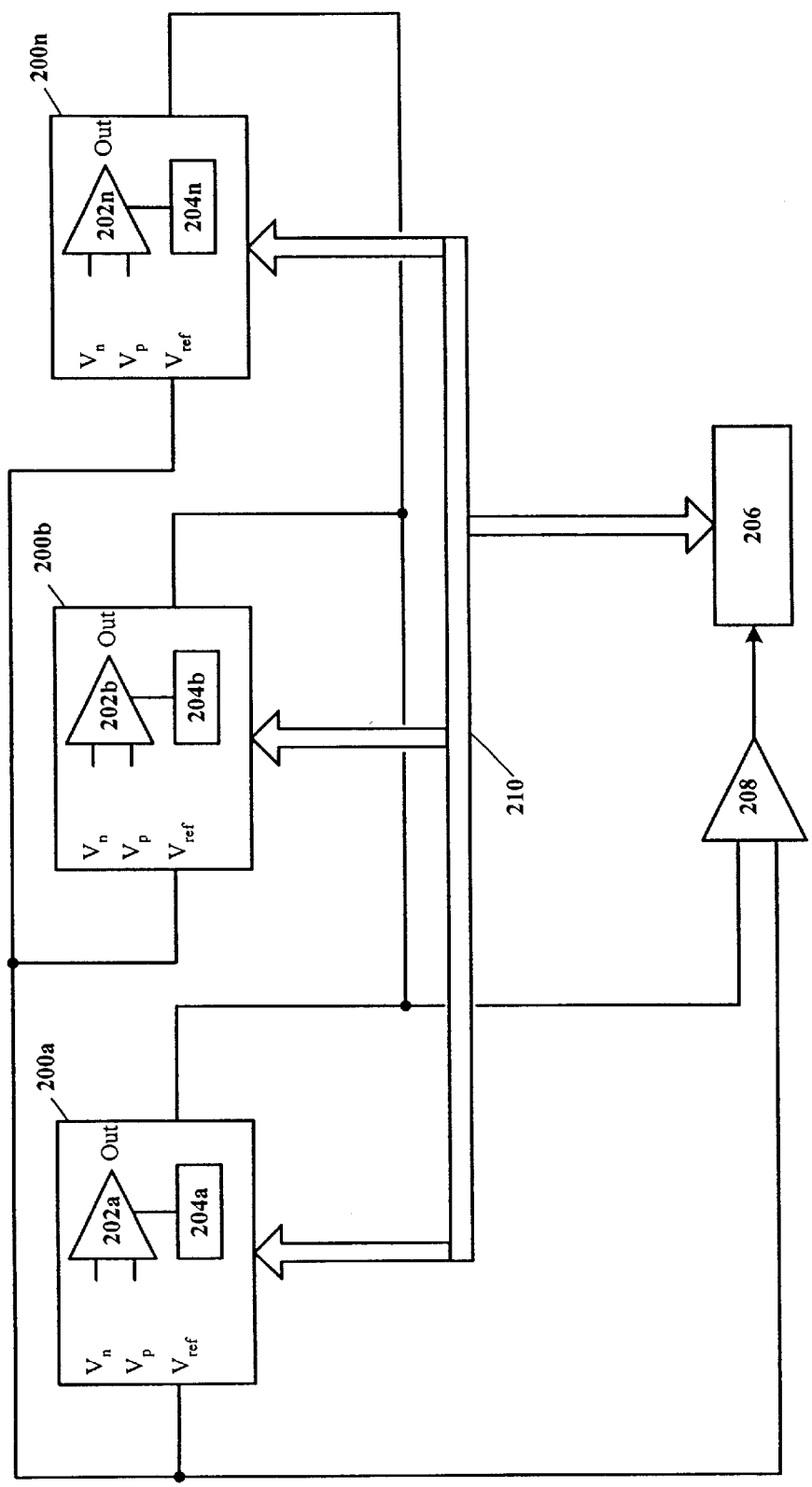
FIG. 3 is a schematic circuit diagram of another embodiment of the invention having a plurality of analog input devices having their input offset voltage minimized during a plurality of calibration cycles.

Referring to FIG. 3, a schematic circuit diagram of another embodiment of the invention having a plurality of analog input devices having their input offset voltage minimized during a plurality of calibration cycles is illustrated. A plurality of analog input devices 200a, 200b, ... and 200n may be calibrated for minimum input offset with a single auto-calibration circuit comprising the comparator 208 and the microcontroller 206. Each one of the plurality of analog input devices 200 is selected for input offset calibration thereof. The remaining plurality of analog input devices 200 remain in their normal operating modes. In this way, each of the plurality of analog input devices 200 may be calibrated for minimum input offset, as described hereinabove.

The invention, therefore, is well adapted to carry out the objects and attain the ends and advantages mentioned, as well as others inherent therein. While the invention has been depicted and described and is defined by reference to particular preferred embodiments of the invention, such references do not imply a limitation on the invention, and no such limitation is to be inferred. The invention is capable of considerable modification, alternation and equivalents in form and function, as will occur to those ordinarily skilled in the pertinent arts. The depicted and described preferred embodiments of the invention are exemplary only and are not exhaustive of the scope of the invention. Consequently, the invention is intended to be limited only by the spirit and scope of the appended claims, giving full cognizance to equivalents in all respects.

What is claimed is:

1. A system comprising a microcontroller and a plurality of analog input devices wherein an input offset voltage of each of the plurality of analog devices is adjusted by the microcontroller, said system comprising:
    a microcontroller;
    a calibration circuit having an output coupled to said microcontroller; and
    a plurality of analog input devices, each of said plurality of analog input devices having an input offset voltage compensation circuit,
    wherein each of said input offset voltage compensation circuits is coupled to the calibration circuit during a calibration cycle of a respective one of said plurality of analog input devices, and
    whereby input offset voltages of said plurality of analog input devices are compensated for during the calibration cycles thereof by, said microcontroller controlling the input offset voltage compensation circuits.

2. The system of claim 1, wherein said plurality of analog input devices are selected from the group consisting of operational amplifiers, comparators, multipliers and logarithmic amplifiers.

3. The system of claim 1, wherein each of the input offset voltage compensation circuits further comprise an input offset compensation register, wherein the input offset compensation register stores an input offset voltage calibration value for a respective one of said plurality of analog input devices.

4. The system of claim 1, wherein said calibration circuit comprises a comparator.

5. The system of claim 1, wherein during the calibration cycle:
    inverting and non-inverting inputs of each of said plurality of analog input devices are coupled to a voltage reference; and
    said calibration circuit is coupled to on an output of each of said plurality of analog input devices when the input offset voltage thereof is being adjusted.

6. The system of claim 5, wherein said calibration circuit causes each of said plurality of analog input devices to have high gain during the calibration cycle.

7. The system of claim 5, wherein the voltage reference is programmable.

8. The system of claim 1, wherein the calibration circuit comprises:
    a comparator having a first input connected to the voltage reference, a second input connected to the output of said analog input device and an output connected to said microcontroller, wherein a logic level change in the output of said comparator indicates to said microcontroller that the input offset voltage has been minimized.

9. The system of claim 1, wherein said microcontroller, said plurality of analog input devices, and said calibration circuit are fabricated on an integrated circuit die.

10. The system of claim 9, further comprising an integrated circuit package enclosing said integrated circuit die.

11. The system of claim 10, wherein said integrated circuit package is selected from a group consisting of plastic dual in-line package (PDIP), small outline (SO), shrink small outline package (SSOP), thin shrink small outline package (TSSOP), windowed ceramic dual in-line package (CERDIP), leadless chip carrier (LCC), plastic leaded chip carrier (PLCC), plastic quad flatpack package (PQFP), thin quad flatpack package (TQFP), pin grid array (PGA), ball grid array (BGA), TO-220, TO-247 and TO-263.

12. The system of claim 1, further comprising circuit functions selected from the group consisting of a random access memory, an electrically programmable read only memory, a serial interface, an analog-to-digital converter, a digital-to-analog converter, digital input-output, a timer, and a programmable switching mode controller.

13. The system of claim 12, wherein said microcontroller, said plurality of analog input devices, said calibration circuit, and said circuit functions are fabricated on an integrated circuit die.

14. The system of claim 13, further comprising an integrated circuit package enclosing said integrated circuit die.

15. An analog input device having an input offset voltage calibrated by a microcontroller, comprising:
    an analog input device having an input offset voltage compensation circuit; and
    a calibration circuit coupled to said analog input device and the input offset voltage compensation circuit, said calibration circuit coupled to a microcontroller, wherein during a calibration cycle
inverting and non-inverting inputs of said analog input device are connected to a voltage reference; and
said calibration circuit monitors a signal on an output of said analog input device and adjusts the input offset compensation circuit so as to minimize the input offset of said analog input device.

16. The analog input device of claim 15, wherein said analog input device is an operational amplifier.

17. The analog input device of claim 15, wherein said analog input device is a comparator.

18. The analog input device of claim 15, wherein said calibration circuit comprises a comparator, said comparator having a first input connected to the voltage reference, a second input connected to the output of said analog input device and an output connected to said microcontroller, wherein a logic level change in the output of said comparator indicates to said microcontroller that the input offset voltage has been minimized.

19. The analog input device of claim 15, wherein said calibration circuit causes said analog input device to have high gain during the calibration cycle.

20. The analog input device of claim 15, further comprising:
an input offset compensation register coupled to the input offset compensation circuit and said microcontroller.

21. The analog input device of claim 20, wherein said input offset compensation register stores a digital value representative of the minimized input offset determined during the calibration cycle of said analog input device.

22. The analog input device of claim 21, further comprising a plurality of analog input devices, wherein each of the plurality of analog input devices has an input offset voltage compensation circuit.

23. The analog input device of claim 22, further comprising an input offset compensation latch register for each one of said plurality of analog input devices, and connected between the input offset compensation circuit of each of said plurality of analog input devices and said microcontroller, wherein each respective input offset compensation latch register stores a digital value representative of the minimized input offset determined during the calibration cycle for each one of said plurality of analog input devices.

24. The analog input device of claim 15, wherein said analog input device and said calibration circuit are fabricated on an integrated circuit die.

25. The analog input device of claim 24, further comprising an integrated circuit package enclosing said integrated circuit die.

26. The analog input device of claim 25, wherein said integrated circuit package is selected from a group consisting of plastic dual in-line package (PDIP), small outline (SO), shrink small outline package (SSOP), thin shrink small outline package TSSOP), windowed ceramic dual in-line package (CERDIP), leadless chip carrier (LCC), plastic leaded chip carrier (PLCC), plastic quad flatpack package (PQFP), thin quad flatpack package (TQFP), pin grid array (PGA), ball grid array (BGA), TO-220, TO-247 and TO-263.

27. The analog input device of claim 15, wherein the voltage reference is programmable.

* * * * *